United States Patent
Xu et al.

(10) Patent No.: US 11,545,464 B2
(45) Date of Patent: Jan. 3, 2023

(54) DIODE FOR USE IN TESTING SEMICONDUCTOR PACKAGES

(71) Applicant: Intel Corporation, Santa Clara, CA (US)

(72) Inventors: Yi Xu, Folsom, CA (US); Hyoung Il Kim, Folsom, CA (US); Florence Pon, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 859 days.

(21) Appl. No.: 16/235,859

(22) Filed: Dec. 28, 2018

(65) Prior Publication Data

US 2020/0212009 A1 Jul. 2, 2020

(51) Int. Cl.
*H01L 23/48* (2006.01)
*H01L 25/18* (2006.01)
*H01L 25/00* (2006.01)
*H01L 23/00* (2006.01)
*H01L 25/065* (2006.01)
*H01L 21/66* (2006.01)

(52) U.S. Cl.
CPC .......... *H01L 25/0657* (2013.01); *H01L 22/12* (2013.01); *H01L 22/34* (2013.01); *H01L 2225/0651* (2013.01); *H01L 2225/06506* (2013.01); *H01L 2225/06562* (2013.01); *H01L 2225/06586* (2013.01); *H01L 2225/06596* (2013.01)

(58) Field of Classification Search
CPC . H01L 2224/48145; H01L 2225/06596; H01L 2225/06506; H01L 2225/0651
See application file for complete search history.

(56) References Cited

U.S. PATENT DOCUMENTS

| | | | | |
|---|---|---|---|---|
| 5,565,767 A | * | 10/1996 | Yoshimizu | G01R 31/2884 324/756.07 |
| 9,111,846 B1 | * | 8/2015 | Whang | H01L 24/85 |
| 9,349,610 B2 | * | 5/2016 | Whang | H01L 23/60 |
| 2019/0206827 A1 | * | 7/2019 | Eskandar | H01L 25/0657 |
| 2020/0235018 A1 | * | 7/2020 | Kim | H01L 24/73 |

* cited by examiner

*Primary Examiner* — Bradley Smith
*Assistant Examiner* — David J Goodwin
(74) *Attorney, Agent, or Firm* — Schwabe, Williamson & Wyatt, P.C.

(57) ABSTRACT

Embodiments described herein provide techniques for testing a semiconductor package by using a diode to couple a test pad to a contact pad. In one scenario, a package comprises a die stack comprising one or more dies and a molding compound encapsulating the die stack. In this package, a substrate is over the molding compound. Also, a test pad and a contact pad are on a surface of the substrate. The contact pad is coupled to the die stack. A diode couples the test pad to the contact pad. In one example, the test pad is coupled to a P side of the diode's P-N junction and the contact pad is coupled to an N side of the diode's P-N junction. In operation, current can flow from the test pad through the contact pad (and the die stack), but current cannot flow from the contact pad through the test pad.

18 Claims, 6 Drawing Sheets

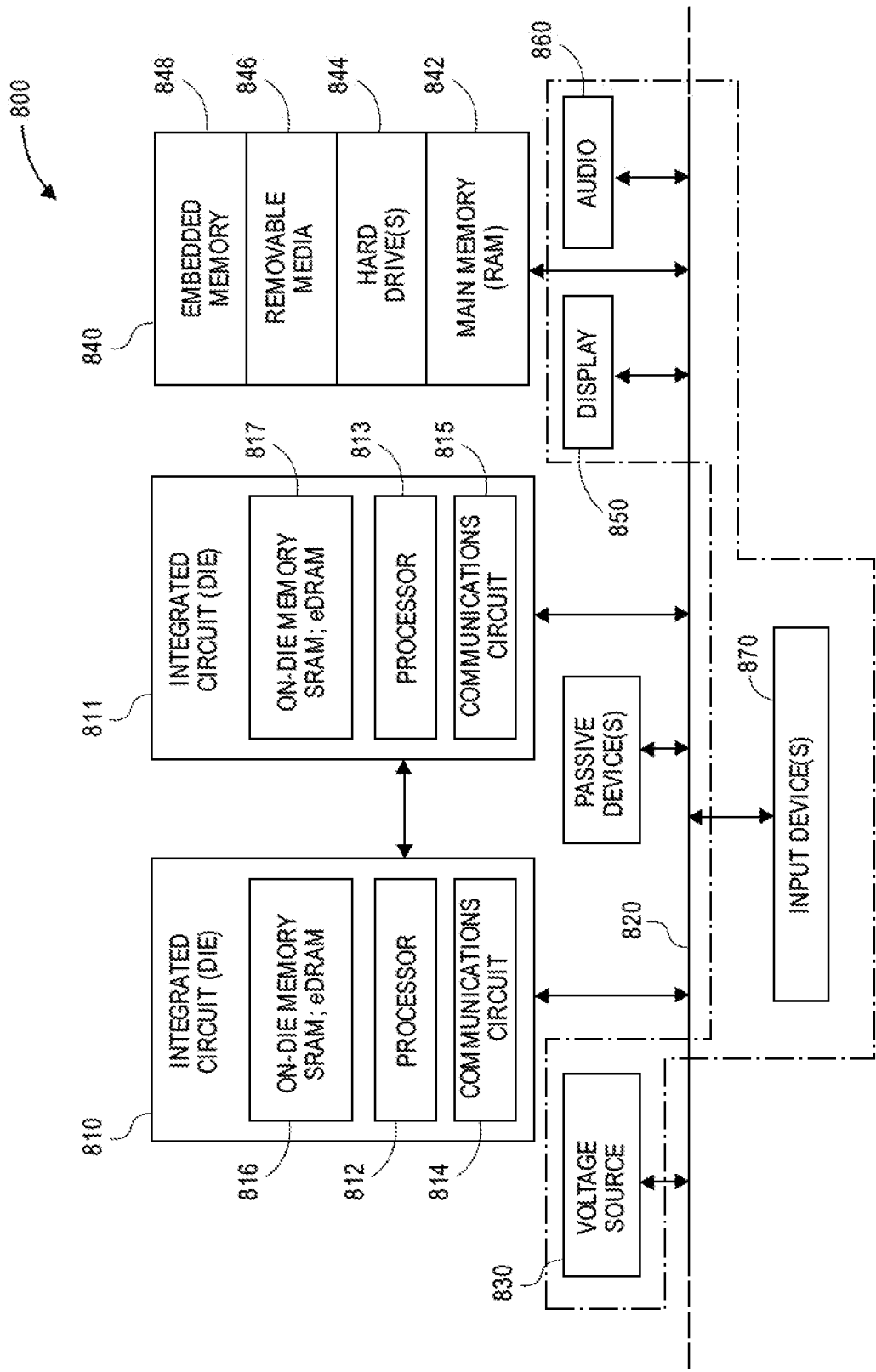

DIODE FOR USE IN TESTING SEMICONDUCTOR PACKAGES

BACKGROUND

Field

Embodiments described herein generally relate to semiconductor packages. More particularly, but not exclusively, embodiments described herein relate to using a diode to couple a test pad to a contact pad in order to test a semiconductor package.

Background Information

A semiconductor package generally includes one or more contact pads coupled to components within or on the semiconductor package. The contact pad(s) may be formed in or on the semiconductor package for propagation of electrical signals (e.g., high speed signals, etc.).

To ensure proper operation of a semiconductor package, its connections, and its devices, test pads may be formed on the semiconductor package. The test pads are electrically coupled to the devices in the package and a voltage is applied to the test pad to test the devices, from which data is acquired to determine proper operation of the semiconductor package's devices (e.g., one or more dies coupled to the contact pad, etc.).

Following testing, the test pads are removed from the semiconductor package. However, this removal process is tedious, imprecise, and costly, which in turn reduces the yield and reliability of semiconductor packages. Furthermore, if the test pads are left coupled to the devices of the semiconductor package, the test pads and conductive traces to the test pads function as an antenna and will induce unwanted interference during the operation of the semiconductor package.

Additionally, test pads may be formed on a semiconductor package at locations that are not ideal. For example, a test pad may be located on a semiconductor package at or over 500 µm away from a device that is designed as a high speed input/output (I/O or IO) interface. These distances can negatively affect accurate testing of high speed signal integrity, which may result in a failure to reveal faulty connections or components in a semiconductor package. Due to this drawback, the use of test pads is limited to testing semiconductor packages that are not designed to handle high speed signals. Thus, in some scenarios, test pads cannot be used to test semiconductor packages that are designed for high speed applications. Another way to minimize the drawback described above is to move test pads closer to contact pads on a substrate. This solution, however, remains suboptimal because, as IO densities of semiconductor packages continue to increase, it may become increasingly difficult or impossible to place test pads near contact pads.

In view of the description provided above, one or more current techniques of coupling test pads to contact pads in order to test a semiconductor package's devices remain suboptimal.

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

FIG. 8 illustrates a computer system, according to one embodiment.

DETAILED DESCRIPTION

Figure 1A:
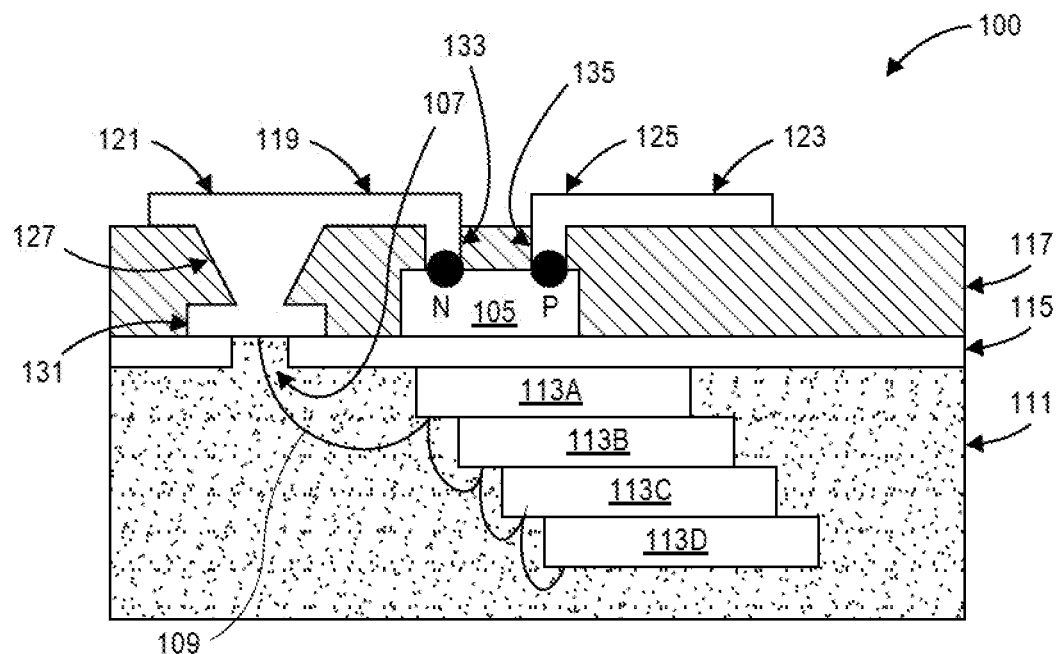
FIGS. 1A-1B illustrate cross-sectional side and plan views of a semiconductor package comprising a die stack and a diode, according to an embodiment.

In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein provide techniques for using a diode to couple a test pad to a contact pad in order to test a semiconductor package. In one embodiment, the diode is any diode having a P-N junction (e.g., a signal diode, a rectifier diode, etc.). In one embodiment, a semiconductor package includes a diode that couples a test pad and contact pad to each other, where the test pad and the contact pad are on a substrate (e.g., a redistribution layer (RDL), etc.). In one embodiment, the test pad is coupled to the P-side (e.g., the anode, etc.) of the diode's P-N junction and the contact pad is coupled to the N-side (e.g., the cathode, etc.) of the diode's P-N junction. In this embodiment, when a positive voltage is applied to the test pad, a current flows from the test pad through the diode and the contact pad to other components of semiconductor package (e.g., a wire, a trace, a pad, a via, an inductor, a capacitor, a die stack comprising one or more dies, etc.). Furthermore, and in this embodiment, when a voltage is applied to the contact pad, a current flows through the contact pad to the other components of semiconductor package and does not flow through the diode and the test pad. In another embodiment, the test pad is coupled to the N-side (e.g., the cathode, etc.) of the diode's P-N junction and the contact pad is coupled to the P-side (e.g., the anode, etc.) of the diode's P-N junction. In this embodiment, when a negative voltage is applied to the test pad, a current flows through the test pad, the diode, and the contact pad to other components of semiconductor package (e.g., a wire, a trace, a pad, a via, an inductor, a capacitor, a die stack comprising one or more dies, etc.). Furthermore, and in this embodiment, when a voltage is applied to the contact pad, a current flows through the contact pad to the other components of semiconductor package and does not flow through the diode and the test pad.

As shown above, the diode allows electrical current to pass through the diode's P-N junction in only one direction. Consequently, there is no need to remove the test pads or sever (or otherwise break) the wires or traces after testing is completed. Also, the diode can couple the test pad and the contact pad in a way that allows for testing contact pads that are designed as high speed IO interfaces. For example, the diode can be embedded in a substrate (e.g., a redistribution layer (RDL), etc.) or adjacently located next to a die stack (i.e., one or more dies) that is encapsulated by a molding compound. As a result, the test pad can placed anywhere on the substrate at any distance away from a contact pad without degrading the integrity or quality of signals used to test the high speed contact pad.

Using a diode to couple a test pad to a contact pad in a semiconductor package has several advantages (e.g., doing away with the need to remove test pads, doing away with the need to sever (or otherwise break) the wires or traces after testing is completed, enabling test pads to be placed anywhere on a substrate for high speed applications, etc.). These advantages assist with reducing costs associated with semiconductor packaging and manufacturing, improving the dependability of using test pads to test semiconductor packages designed for high speed applications, and increasing the yield and reliability of semiconductor packages.

Figure 1B:
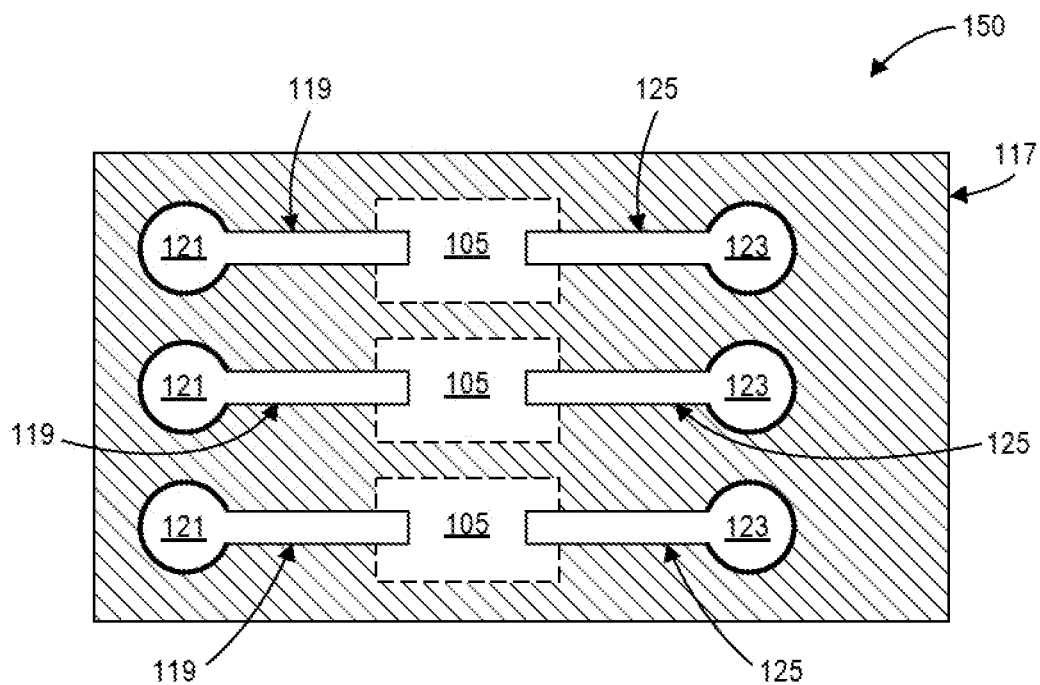

FIGS. 1A-1B illustrate cross-sectional side and plan views 100, 150 of a semiconductor package comprising a die stack and a diode, according to an embodiment. With regard now to FIG. 1A, a semiconductor package is shown. The semiconductor package comprises: a contact pad 121 coupled to a trace 119; a test pad 123 coupled to a trace 125; a diode 105 coupled to the traces 119 and 125; a solder resist opening (SRO) 107; a wire 109; a die stack comprising dies 113A-D coupled to the wire 109; a solder resist layer 115; a molding compound 111 encapsulating the dies 113A-D and the wire 109; and a substrate 117.

The diode 105 is any diode that comprises a P-N junction (e.g., a signal diode, a rectifier diode, etc.). As a result, the diode 105 allows current to flow in only one direction. That is, when a positive voltage is applied to the P side of the diode 105's P-N junction, current can only flow from the P-side of the P-N junction to the N-side of the P-N junction, and not vice versa. Alternatively, when a negative voltage is applied to the N side of the diode 105's P-N junction, current can only flow from the N-side of the P-N junction to the P-side of the P-N junction, and not vice versa.

In FIG. 1A, the trace 125 couples the test pad 123 to a via 135 that is coupled to an anode of the diode 105. The anode of the diode 105 comprises a P-side of the diode 105's P-N junction. Each of the trace 125, the test pad 123, and the via 135 may be formed from copper, gold, any other suitable conductive material, or any combination of suitable conductive materials.

A first pad 131 embedded in the substrate 117 is coupled to a via 127 that is also embedded in the substrate 117. The via 127 is coupled to a second pad 121 on the substrate 117. A trace 119 couples the second pad 121 on the substrate 117 to a via 133 that is coupled to a cathode of the diode 105 (e.g., an N-side of the diode 105's P-N junction, etc.). The first pad 131, the via 127, the second pad 121, the trace 119, and the via 133 may be formed from copper, gold, any other suitable conductive material, or any combination of suitable conductive materials. In one embodiment, two or more of the contact pad 121, the trace 119, the via 127, the via 133, and the first pad 131 are collectively designed to form a high speed IO interface. In one embodiment, the second pad 121 is designed as a high speed IO interface. The second pad 121 may be referred to herein as a contact pad 121.

The substrate 117 can be formed as a redistribution layer, which comprises conductive routing (not shown) that makes a contact pad (e.g., the contact pad 121, etc.) available in other locations. For example, the substrate 117 may include routing, such as vias, traces, and pads, as is known in the art. In an embodiment, the diode 105 may be embedded in the substrate 117. That is, the substrate 117 may be formed along sidewall surfaces and a top surface of the diode 105. In an embodiment, vias 133 and 135 through the substrate 117 may electrically couple the test pad 123 and the contact pad 121 to the diode 105.

The semiconductor package shown in FIG. 1A also includes a solder resist layer 115 under the substrate 117. The solder resist layer 115 also includes an SRO 107 that allows a wire 109 to be used for coupling the first pad 131 to a die stack comprising dies 113A-D. Additionally, a molding compound 111 is under the solder resist layer 115 that encapsulates the wire 109 and the die stack comprising dies 113A-D.

With regard now to FIG. 1B, a plan view 150 of the semiconductor package shown in FIG. 1A is shown. The semiconductor package comprises multiple contact pads 121 coupled to traces 119, where each contact pad 121 is coupled to a single trace 119. The contact pad 121 and the trace 119 are described above in connection with FIG. 1A. In one embodiment, at least one combination of a contact pad 121 and a trace 119 is designed as a high speed IO interface. Each of the traces 119 is coupled to a diode 105 as described above in connection with FIG. 1A. As shown in FIG. 1B, the diode 105 has a dashed outline to indicate that the diode 105 is embedded in the substrate 117.

The semiconductor package also comprises multiple test pads 123 coupled to traces 125, where each test pad 123 is coupled to a single trace 125. The test pad 123 and the trace 125 are described above in connection with FIG. 1A. Each of the traces 125 is coupled to a diode 105, as described above in connection with FIG. 1A.

In one embodiment, application of a positive voltage to a test pad 123 results in creation of a current that flows from the test pad 123 through a trace 125 coupled to the test pad 123, a P-side of the diode 105's P-N junction, an N-side of the diode 105's P-N junction, a trace 119, and a contact pad 121 that is coupled to the trace 119. In this way, the contact pad 121 (and any other components of the semiconductor package that are coupled to the contact pad 121) can be tested.

On the other hand, application of a voltage to a contact pad 121 results in creation of a current that flows from the contact pad 121 to any other components of the semiconductor package that are coupled to the contact pad 121. However, the created current will not flow through the N-side of the diode 105's P-N junction to a P-side of the diode 105's P-N junction, to the trace 125 and then to the test pad 123. This is because the current cannot flow from diode 105's N-side to its P-side. Thus, applying a voltage to the contact pad 121 can be achieved without activating the test pad 123. Consequently, the test pad 123 can be functionally disabled through use of the diode 105.

As explained in the Background section, wires or traces can be used to directly couple the test pad 123 to the contact pad 121. After testing is completed, these wires or traces have to be physically broken to sever the connection between the contact pad and the test pad. In contrast, the diode 105 provides a connection between the test pad 123 and the contact pad 121 that functionally disables the test pad after testing is complete. This is because the diode 105 only allows for current to flow in one direction. When the testing is no longer required, the diode prevents current flowing through the contact pad 121 from passing through the diode 105 to the test pad 123. In this way, the diode 105 enables deactivation of the test pad 123 on an as-needed basis. One advantage of this architecture is that there is no need remove the test pad 123 from the semiconductor package shown in FIGS. 1A-1B. Another advantage is that there is no need to physically break any wires or traces between the test pad 123 and the contact pad 121. In view of these and other advantages, the yield and reliability of semiconductor packages and the dependability of using test pads can be improved.

While the diode 105 functions to sever the electrical connection to the test pad 123, there is still a conductive trace between the contact pad 121 and the diode 105 that may provide interference or otherwise negatively interact with the functioning of the semiconductor package. As such, embodiments may include positioning the diode 105 as close to the contact pad 121 as possible in order to reduce the length of the trace between the contact pad 121 and the diode 105. For example, and as shown in FIG. 1A, the diode 105 can be embedded in the substrate 117 (e.g., a redistribution layer (RDL), etc.). For another example, and with regard to FIG. 2, a diode 205 can be adjacently located next to a die stack (i.e., one or more dies 213A-B) that is encapsulated by a molding compound 211. For yet another example, and with regard to FIG. 3, a diode 305 can be included as part of a die stack (i.e., one or more dies 313A-B) that is encapsulated by a molding compound 311. Here, the diode 305 is in contact with the dies 313A-B. As shown in FIGS. 1A-3, the test point (e.g., test point 123, 201, 301, etc.) can placed anywhere in a semiconductor package at any distance away from a contact point (e.g., contact point 121, 203, 303, etc.) without degrading the integrity or quality of signals used to test the contact pad. Accordingly, the test points 123, 203, 303, etc. may have any desired spacing in order to accommodate existing testing architectures (e.g., device tester sockets).

Figure 2:
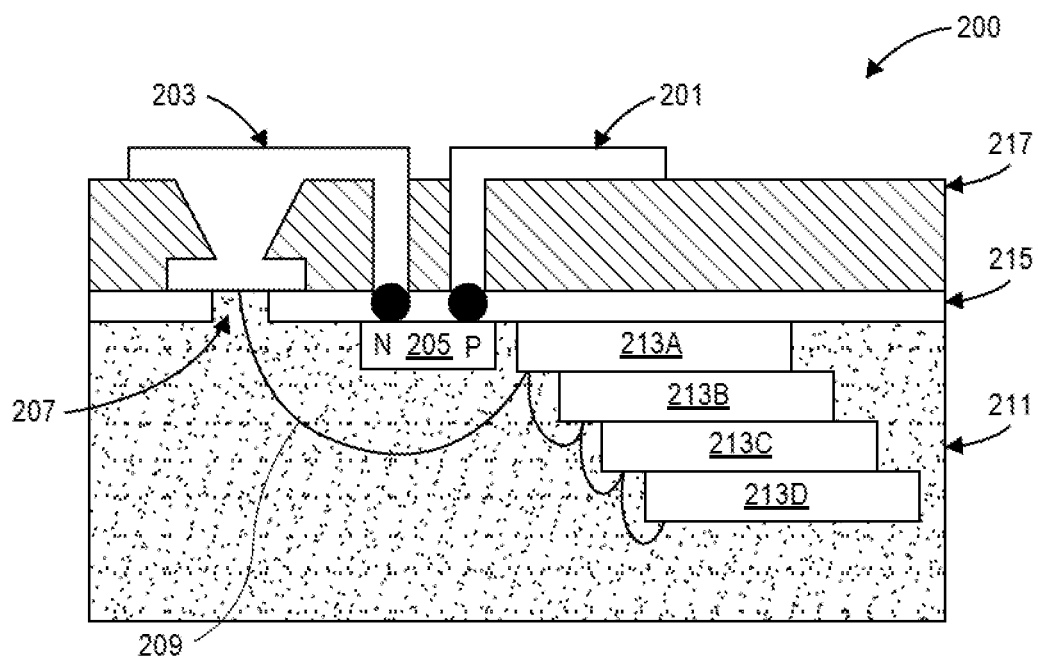
FIG. 2 illustrates a cross-sectional side view of a semiconductor package comprising a die stack and a diode, according to another embodiment.

FIG. 2 illustrates a cross-sectional side view 200 of a semiconductor package comprising a die stack and a diode, according to another embodiment. The package shown in FIG. 2 is similar to the package shown in FIGS. 1A-1B, with the exception that the diode 205 is shown as being adjacent to the dies 213A-D and encapsulated in the molding compound 211.

Figure 3:
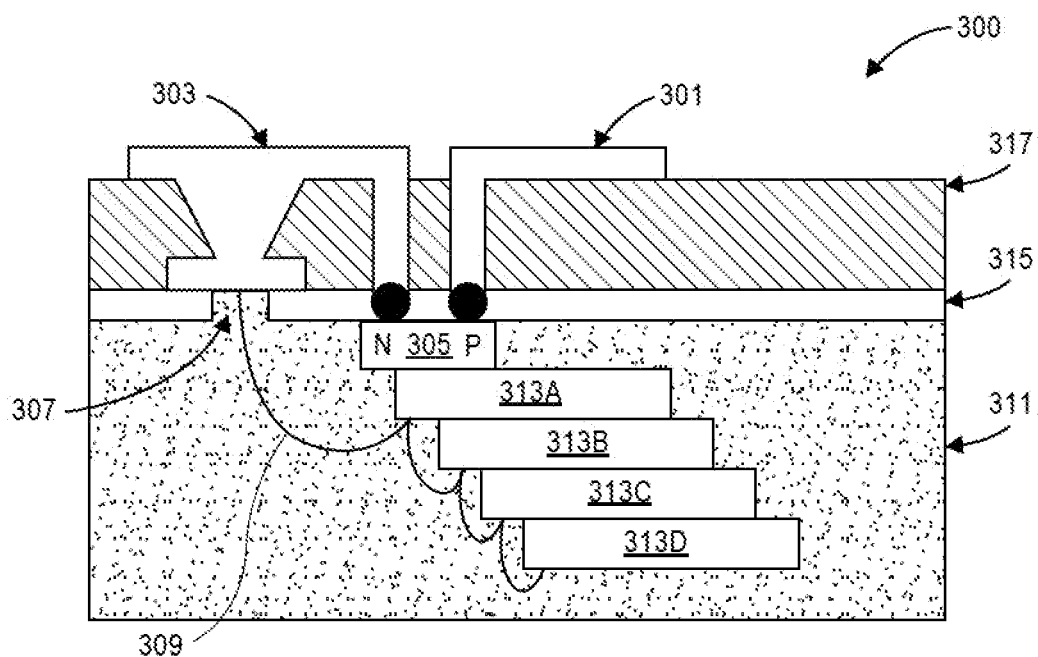
FIG. 3 illustrates a cross-sectional side view of a semiconductor package comprising a die stack and a diode, according to yet another embodiment.

FIG. 3 illustrates a cross-sectional side view 300 of a semiconductor package comprising a die stack and a diode, according to yet another embodiment. The package shown in FIG. 3 is similar to the package shown in FIGS. 1A-1B, with the exception that the diode 305 is shown as part of the die stack comprising the dies 313A-D and encapsulated in the molding compound 311. That is, the diode 305 is in contact with the dies 313A-D.

Figure 4A:
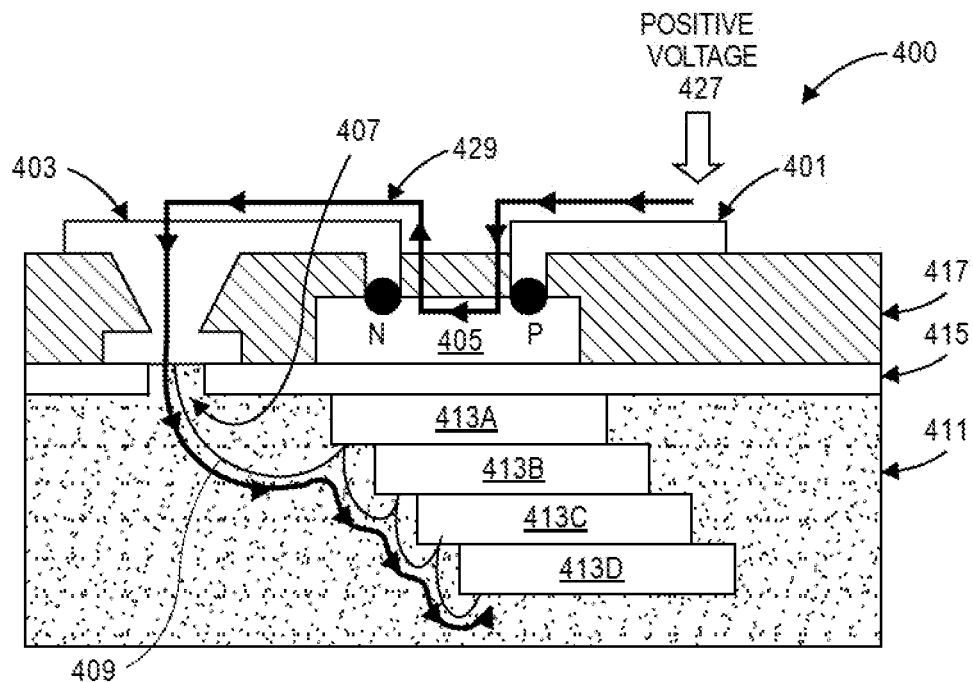
FIGS. 4A-4B illustrate operations of a diode using cross-sectional side views of a semiconductor package comprising the diode, according to an embodiment.
Figure 4B:
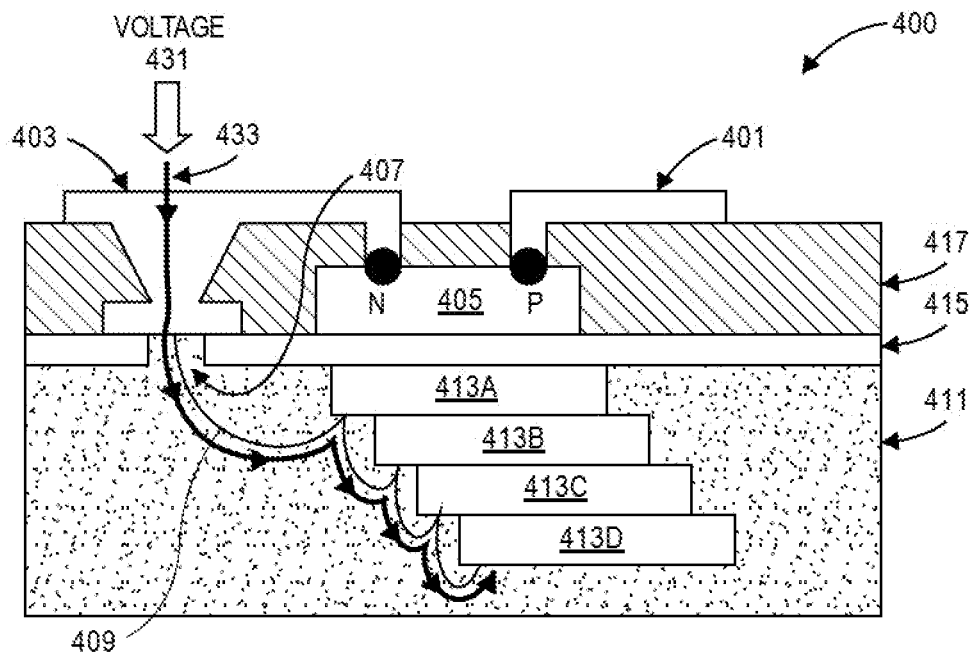

FIGS. 4A-4B illustrate operations of a diode 405 using cross-sectional side views of a semiconductor package 400 comprising the diode 405, according to an embodiment. Referring now to FIG. 4A, the semiconductor package 400 comprises a molding compound 411 encapsulating dies 413A-D, a solder resist layer 415 having an SRO 407 on the molding compound 411, a substrate 417 (e.g., an RDL, etc.) on the solder resist layer 415, a test point 401 comprising a test pad and a trace on the substrate 417, a contact point 403 comprising a contact pad and a trace on substrate 417, a diode 405 comprising a P-N junction embedded in the substrate 417, and a wire 409 that passes through the SRO 407 and couples the contact point 403 to the dies 413A-D. As shown in FIG. 4A, a positive voltage 427 is applied to the test point 401. The positive voltage 427 enables a current 429 to flow from the test point 401 through a P side of the diode 405's P-N junction, an N side of the diode 405's P-N junction, the contact point 403, and a wire 409 coupling dies 413A-D to the contact point 403. In this way, the dies 413A-D can be tested. It is to be appreciated that the components being tested can include inductors, capacitors, or any other component or combination of components known in the art.

With regard now to FIG. 4B, an operation of the diode 405 after testing is completed is shown. A voltage 431 is applied to the contact point 403. The voltage 431 can be provided via a suitable interconnect architecture, such as wire bonding, ball grid array, pin grid array, land grid array, or the like. The voltage 431 enables a current 433 to flow from the contact point 403 through the wire 409 coupling dies 413A-D to the contact point 403. As shown, the current 433 does not flow through the diode 405 to the test point 401. This is because the diode 405 only allows current to flow in one direction: from the P-side of the diode 405's P-N junction to the N-side of the diode 405's P-N junction. As a result, the test point 401 is functionally severed from the contact point 403 without having to remove the test point 401 or physically break any wires or traces.

Figure 5A:
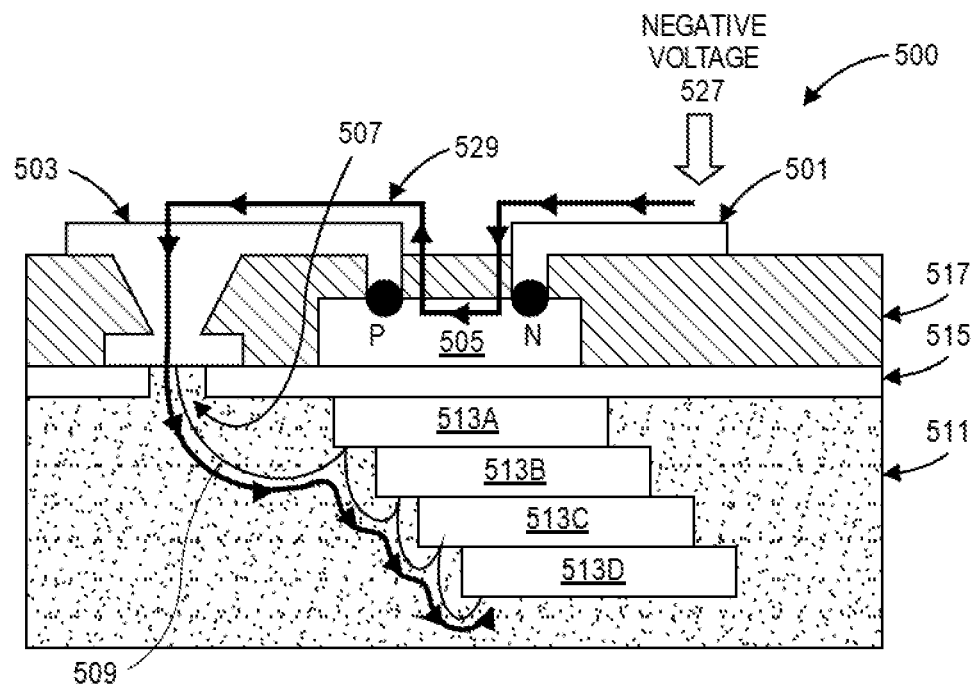
FIGS. 5A-5B illustrate operations of a diode using cross-sectional side views of a semiconductor package comprising the diode, according to another embodiment.
Figure 5B:
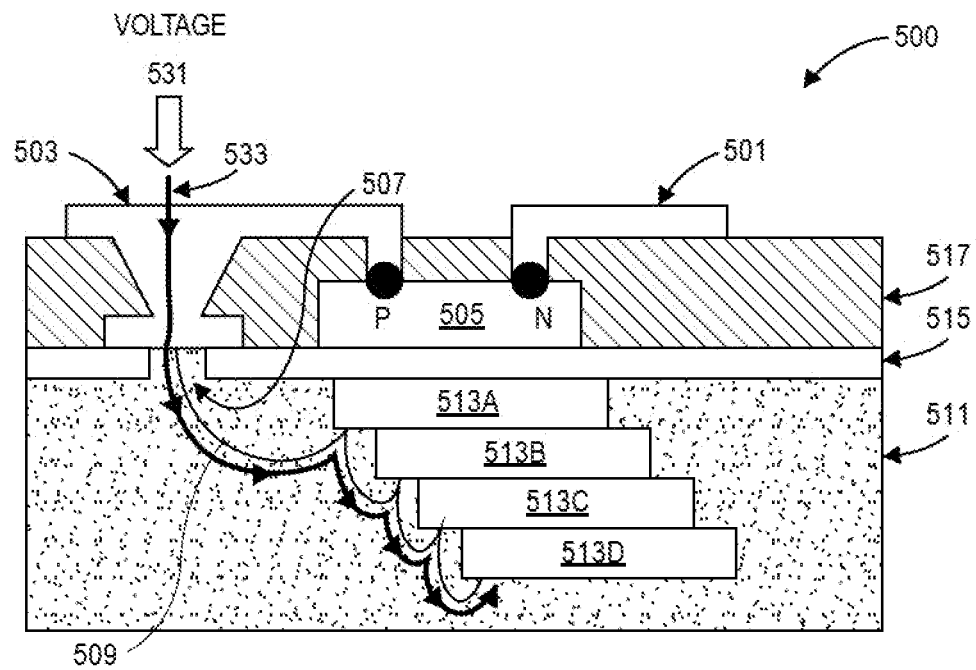

FIGS. 5A-5B illustrate operations of a diode 505 using cross-sectional side views of a semiconductor package 500 comprising the diode 505, according to another embodiment. With regard now to FIG. 5A, the semiconductor package 500 comprises a molding compound 511 encapsulating dies 513A-D, a solder resist layer 515 having an SRO 507 on the molding compound 511, a substrate 517 (e.g., an RDL, etc.) on the solder resist layer 515, a test point 501 comprising a test pad and a trace on the substrate 517, a contact point 503 comprising a contact pad and a trace on substrate 517, a diode 505 comprising a P-N junction embedded in the substrate 517, and a wire 509 passing through the SRO 507 and coupling the contact point 503 to the dies 513A-D. As shown in FIG. 5A, a negative voltage 527 is applied to the test point 501. The negative voltage 527 enables a current 529 to flow from the test point 501 through an N side of the diode 505's P-N junction, a P side of the diode 505's P-N junction, the contact point 503, and a wire 509 coupling dies 513A-D to the contact point 503. In this way, the dies 513A-D can be tested. It is to be appreciated that the components being tested can include inductors, capacitors, or any other component or combination of components known in the art.

Moving on to FIG. 5B, an operation of the diode 505 after testing is completed is shown. A voltage 531 is applied to the contact point 503. The voltage 531 can be provided via a suitable interconnect architecture, such as wire bonding, ball grid array, pin grid array, land grid array, or the like. This voltage 531 enables a current 533 to flow from the contact point 503 through the wire 509 coupling dies 513A-D to the contact point 503. As shown, the current 533 does not flow through the diode 505 to the test point 501. This is because the diode 505 only allows current to flow in one direction: from the N-side of the diode SOS's P-N junction to the P-side of the diode SOS's P-N junction. As a result, the test point 501 is functionally severed from the contact point 503 without having to remove the test point 501 or physically break any wires or traces.

Figure 6:
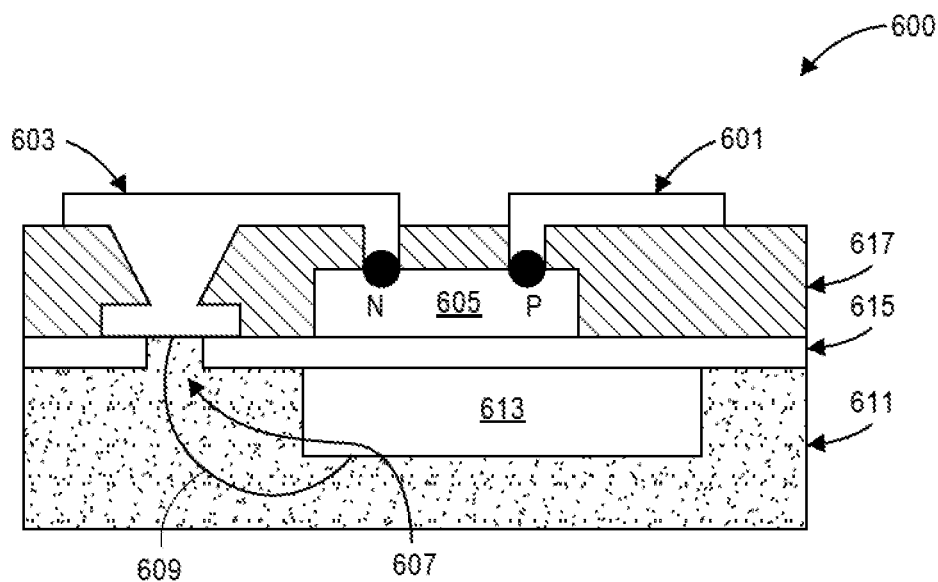
FIG. 6 illustrates a cross-sectional side view of a semiconductor package comprising a single die and a diode, according to another embodiment.

FIG. 6 illustrates a cross-sectional side view 600 of a semiconductor package comprising a single die 613 and a diode 605, according to another embodiment. The package shown in FIG. 6 is similar to the package shown in FIGS. 1A-1B, with the exception that only one die 613 is shown in FIG. 6 (as opposed to the plurality of die 113A-D shown in FIG. 1A). It is to be appreciated that any number of dies may be included in a semiconductor package that uses a diode (e.g., diode 105, 205, 305, 405, 505, 605, etc.) for coupling a test pad/point to a contact pad/point. For example, the package may include one, two, three, four, or any other number of dies.

Figure 7:
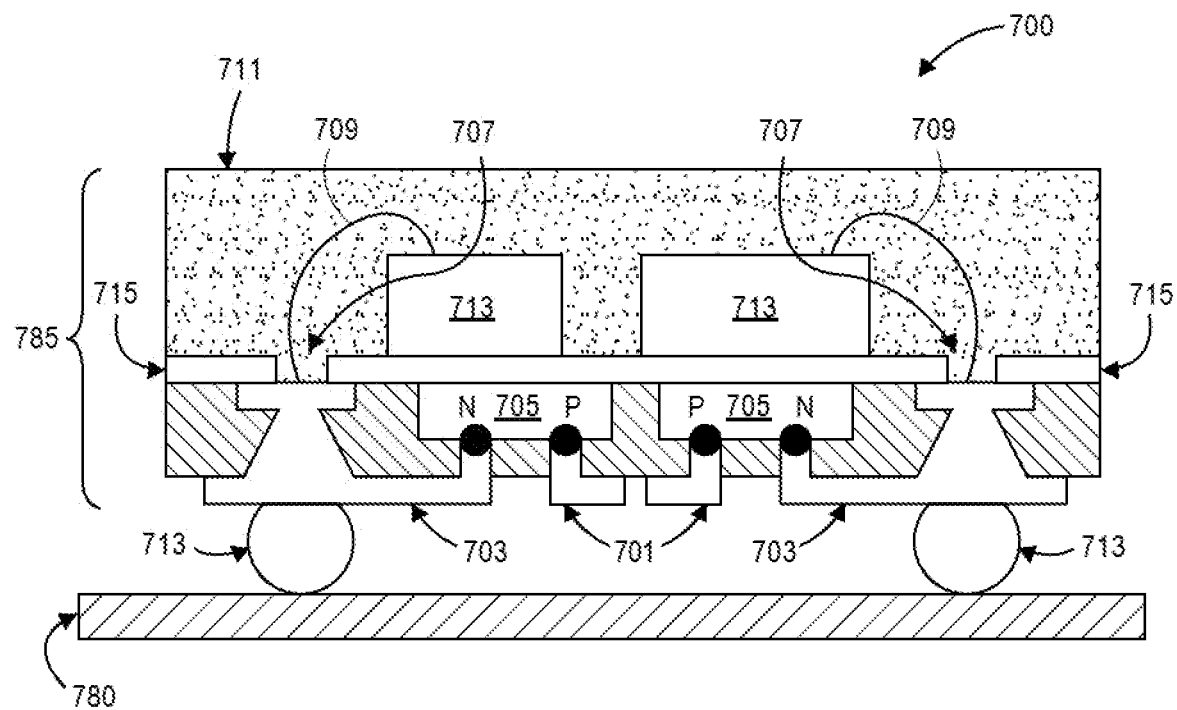
FIG. 7 illustrates a cross-sectional side view of a packaged system comprising a semiconductor package and a board (e.g., a printed circuit board, etc.), according to an embodiment.

FIG. 7 illustrates a cross-sectional side view of a packaged system 700 comprising a semiconductor package 785 and a board 780 (e.g., a printed circuit board, etc.), according to an embodiment. In an embodiment, the packaged system 700 may include a semiconductor package 785. The package 785 comprises components that are similar to or the same as the components described above in connection with the package shown in FIGS. 1A-B, the package shown in FIG. 2, the package shown in FIG. 3, the package shown in FIGS. 4A-B, the package shown in FIGS. 5A-B, and the package shown in FIG. 6. For brevity, these components are not described again.

In an embodiment, the packaged system 700 may include the semiconductor package 785 electrically coupled to a board 780 (e.g., a PCB, etc.) with solder bumps 713 or any other suitable interconnect architecture, such as wire bonding, ball grid array, pin grid array, land grid array, or the like.

As shown in FIG. 7, the test points 701 are functionally decoupled from the contact point 703 by diodes 705. Thus, the packaged system 700 can operate without having the test points 701 activated.

FIG. 8 illustrates a computer system 800, according to one embodiment. The computer system 800 (also referred to as an electronic system 800) can include a semiconductor package comprising a diode, a test pad, and a contact pad in accordance with any of the embodiments and their equivalents as set forth in this disclosure. The computer system 800 may be a mobile device, a netbook computer, a wireless smart phone, a desktop computer, a hand-held reader, a server system, a supercomputer, or a high-performance computing system.

The system 800 can be a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In one embodiment, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812. As used herein, the processor 812 may mean any type of circuit such as, but not limited to, a microprocessor, a microcontroller, a graphics processor, a digital signal processor, or another processor. In an embodiment, the processor 812 includes, or is coupled with, a semiconductor package comprising a diode, a test pad, and a contact pad in accordance with any of the embodiments and their equivalents, as described in the foregoing specification. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM). In one embodiment, the on-die memory 816 may be packaged with a process in accordance with any of the embodiments and their equivalents, as described in the foregoing specification.

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 810 includes embedded on-die memory 817 such as eDRAM.

In an embodiment, the electronic system 800 also includes an external memory 840 that may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In an embodiment, the electronic system 800 also includes a display device 850 and an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

At least one of the integrated circuits 810 or 811 can be implemented in a number of different embodiments, including a semiconductor package comprising a diode, a test pad, and a contact pad as described herein, an electronic system, a computer system, one or more methods of fabricating an integrated circuit, and one or more methods of fabricating a semiconductor package comprising a diode, a test pad, and a contact pad, according to any disclosed embodiments set forth herein and their art-recognized equivalents. The elements, materials, geometries, dimensions, and sequence of operations can all be varied to suit particular I/O coupling requirements including array contact count, array contact configuration for a microelectronic die embedded in a processor mounting substrate according to a semiconductor package comprising a diode, a test pad, and a contact pad in accordance with any of the disclosed embodiments as set forth herein and their art-recognized equivalents. A foundation substrate may be included, as represented by the dashed line of FIG. 8. Passive devices may also be included, as is also depicted in FIG. 8.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "for one embodiment," "In an embodiment," "for another embodiment," "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semiconductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures. As used herein, the phrases "A or B", "A and/or B", "one or more of A and B", and "at least one of A or B" means (A), (B), or (A and B).

Embodiments described herein include a semiconductor package, comprising: a die stack comprising one or more dies; a molding compound encapsulating the die stack; a substrate over the molding compound; a test pad on a surface of the substrate; a contact pad on the surface of the substrate and electrically coupled to the die stack; and a diode coupling the test pad to the contact pad, the diode comprising a P-N junction.

Additional embodiments include a semiconductor package, wherein the test pad is coupled to a P-side of the P N junction of the diode and the contact pad is coupled to an N-side of the P-N junction of the diode.

Additional embodiments include a semiconductor package, wherein the test pad is coupled to an N-side of the P N junction of the diode and the contact pad is coupled to a P-side of the P-N junction of the diode.

Additional embodiments include a semiconductor package, wherein the diode is embedded in the substrate.

Additional embodiments include a semiconductor package, wherein the diode is encapsulated by the molding compound.

Additional embodiments include a semiconductor package, wherein the diode is in contact with the die stack.

Additional embodiments include a semiconductor package, wherein the diode is adjacent to the die stack.

Additional embodiments include a semiconductor package, wherein the diode is a signal diode or a rectifier diode.

Additional embodiments include a semiconductor package, wherein the contact pad is a high speed input/output interface.

Embodiments described herein include a method of testing a semiconductor package, the method comprising: coupling a test pad on a substrate to a diode, the diode comprising a P-N junction; coupling a contact pad on the substrate to the diode, wherein the contact pad is coupled to one or more dies; and applying a voltage to the test pad.

Additional embodiments include a method, wherein the voltage is a positive voltage.

Additional embodiments include a method, wherein coupling the test pad on the substrate to the diode comprises coupling the test pad to a P side of the P-N junction of the diode and wherein coupling the contact pad to the diode comprises coupling the contact pad to an N-side of the P-N junction of the diode.

Additional embodiments include a method, wherein the voltage is a negative voltage.

Additional embodiments include a method, wherein coupling the test pad on the substrate to the diode comprises coupling the test pad to an N-side of the P-N junction of the diode and wherein coupling the contact pad to the diode comprises coupling the contact pad to a P-side of the P-N junction of the diode.

Additional embodiments include a method, wherein the diode is a signal diode or a rectifier diode.

Additional embodiments include a method, wherein the contact pad is a high speed input/output interface.

Embodiments described herein include a packaged system, comprising: a semiconductor package, comprising: a die stack comprising a plurality of dies; a molding compound encapsulating the die stack; a redistribution layer over the molding compound; a plurality of test pads on a surface of the substrate; a plurality of contact pads on the surface of the substrate and electrically coupled to the die stack by a wire bond embedded in the molding compound; and a plurality of diodes, each diode comprising a P-N junction, wherein a first terminal of each diode is electrically coupled to one of the contact pads by a conductive trace, and wherein a second terminal of each diode is electrically coupled to one of the test pads by a conductive trace; and a printed circuit board, wherein the semiconductor package is electrically coupled to the printed circuit board by interconnects contacting the contact pads.

Additional embodiments include a packaged system, wherein the test pads are coupled to a P-side terminal of the P-N junction of the diode and the contact pads are coupled to an N-side terminal of the P-N junction of the diode.

Additional embodiments include a packaged system, wherein the test pads are coupled to an N-side of the P-N junction of the diode and the contact pads are coupled to a P-side of the P-N junction of the diode.

Additional embodiments include a packaged system, wherein the diodes are embedded in the substrate.

Additional embodiments include a packaged system, wherein the diodes are encapsulated by the molding compound.

Additional embodiments include a packaged system, wherein at least one of the diodes is a signal diode or a rectifier diode.

Additional embodiments include a packaged system, wherein at least one of the contact pads is a high speed input/output interface.

Additional embodiments include a packaged system, wherein at least one of the diodes is a signal diode or a rectifier diode.

Additional embodiments include a packaged system, wherein at least one of the contact pads is a high speed input/output interface.

The invention claimed is:

1. A semiconductor package, comprising:
   a die stack comprising one or more dies;
   a molding compound encapsulating the die stack;
   a substrate over the molding compound;
   a test pad on a surface of the substrate;
   a contact pad on the surface of the substrate and electrically coupled to the die stack; and
   a diode coupling the test pad to the contact pad, the diode comprising a P-N junction.

2. The semiconductor package of claim 1, wherein the test pad is coupled to a P-side of the P-N junction of the diode and the contact pad is coupled to an N-side of the P-N junction of the diode.

3. The semiconductor package of claim 1, wherein the test pad is coupled to an N-side of the P-N junction of the diode and the contact pad is coupled to a P-side of the P-N junction of the diode.

4. The semiconductor package of claim 1, wherein the diode is embedded in the substrate.

5. The semiconductor package of claim 1, wherein the diode is encapsulated by the molding compound.

6. The semiconductor package of claim 5, wherein the diode is in contact with the die stack.

7. The semiconductor package of claim 5, wherein the diode is adjacent to the die stack.

8. The semiconductor package of claim 1, wherein the diode is a signal diode or a rectifier diode.

9. The semiconductor package of claim 1, wherein the contact pad is a high speed input/output interface.

10. A packaged system, comprising:
    a semiconductor package, comprising:
       a die stack comprising a plurality of dies;
       a molding compound encapsulating the die stack;
       a redistribution layer over the molding compound;
       a plurality of test pads on a surface of the redistribution layer;
       a plurality of contact pads on the surface of the redistribution layer and electrically coupled to the die stack by a wire bond embedded in the molding compound; and
       a plurality of diodes, each diode comprising a P-N junction, wherein a first terminal of each diode is electrically coupled to one of the contact pads by a conductive trace, and wherein a second terminal of each diode is electrically coupled to one of the test pads by a conductive trace; and
    a printed circuit board, wherein the semiconductor package is electrically coupled to the printed circuit board by interconnects contacting the contact pads.

11. The packaged system of claim 10, wherein the test pads are coupled to a P-side terminal of the P-N junction of the diode and the contact pads are coupled to an N-side terminal of the P-N junction of the diode.

12. The packaged system of claim 10, wherein the test pads are coupled to an N-side of the P-N junction of the diode and the contact pads are coupled to a P-side of the P-N junction of the diode.

13. The packaged system of claim 10, wherein the diodes are embedded in the redistribution layer.

14. The packaged system of claim 10, wherein at least one of the diodes is a signal diode or a rectifier diode.

15. The packaged system of claim 10, wherein at least one of the contact pads is a high speed input/output interface.

16. The packaged system of claim 10, wherein the diodes are encapsulated by the molding compound.

17. The packaged system of claim 16, wherein the diodes are in contact with the die stack.

18. The packaged system of claim 16, wherein the diodes are adjacent to the die stack.

* * * * *